United States Patent
Kim et al.

(10) Patent No.: US 10,284,211 B2
(45) Date of Patent: May 7, 2019

(54) INJECTION-LOCKED OSCILLATOR AND SEMICONDUCTOR DEVICE INCLUDING THE SAME

(71) Applicants: SK hynix Inc., Icheon (KR); Seoul National University R&DB Foundation, Seoul (KR)

(72) Inventors: Sungwoo Kim, Daegu (KR); Sungyong Cho, Anyang (KR); Hankyu Chi, Seoul (KR); Suhwan Kim, Seoul (KR); Deog-Kyoon Jeong, Seoul (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 113 days.

(21) Appl. No.: 15/494,130

(22) Filed: Apr. 21, 2017

(65) Prior Publication Data

US 2017/0366195 A1    Dec. 21, 2017

(30) Foreign Application Priority Data

Jun. 21, 2016    (KR) .................. 10-2016-0076972

(51) Int. Cl.
*H03K 3/03*    (2006.01)
*H03L 7/24*    (2006.01)
*H03K 5/156*   (2006.01)

(52) U.S. Cl.
CPC ............. *H03L 7/24* (2013.01); *H03K 3/0315* (2013.01); *H03K 5/1565* (2013.01)

(58) Field of Classification Search
CPC .................................. H03L 7/24; H03K 3/0315
See application file for complete search history.

(56) References Cited

U.S. PATENT DOCUMENTS

| | | | |
|---|---|---|---|
| 8,941,420 B2 | 1/2015 | Zerbe et al. | |
| 2007/0188247 A1* | 8/2007 | Westra | H03B 5/24 331/36 C |
| 2012/0086482 A1* | 4/2012 | Maheshwari | H03L 7/0998 327/156 |

(Continued)

FOREIGN PATENT DOCUMENTS

KR    10-2009-0105052 A    10/2009

OTHER PUBLICATIONS

Hyunik Kim et al., "A 2.4GHz Digital MDLL Using Pulse-Width Comparator and Double Injection Technique in 28nm CMOS," 2016 IEEE International Solid-State Circuits Conference (ISSCC), 2016, pp. 1-31, IEEE.

(Continued)

*Primary Examiner* — Jeffrey M Shin

(57) ABSTRACT

An injection-locked oscillator includes an oscillator and an injection circuit. The oscillator includes a first oscillation node through which a first oscillation signal is output and a second oscillation node through which a second oscillation signal is output, the second oscillation signal having a phase opposite to that of the first oscillation signal. The injection circuit provides an injection current between the first oscillation node and the second oscillation node according to a reference signal. The injection circuit includes a charging element configured to be charged or discharged in response to a reference signal and to provide the injection current between the first oscillation node and the second oscillation node.

19 Claims, 15 Drawing Sheets

(56) References Cited

U.S. PATENT DOCUMENTS

| | | | |
|---|---|---|---|
| 2014/0118045 A1* | 5/2014 | Lee | H03K 5/1565 327/175 |
| 2017/0040941 A1* | 2/2017 | Chatwin | H03K 3/0315 |

OTHER PUBLICATIONS

Hyunik Kim et al., "A 2.4GHz 1.5mW Digital MDLL Using Pulse-Width Comparator and Double Injection Technique in 28nm CMOS", 2016 IEEE International Solid-State Circuits Conference (ISSCC), Feb. 3, 2016, pp. 328-329, IEEE.

Ahmed Musa et al., "A Compact, Low-Power and Low-Jitter Dual-Loop Injection Locked PLL Using All-Digital PVT Calibration," IEEE Journal of Solid-State Circuits, Jan. 2014, pp. 50-60, vol. 49, No. 1, IEEE.

Belal M. Helal et al., "A Low Jitter Programmable Clock Multiplier Based on a Pulse Injection-Locked Oscillator With a Highly-Digital Tuning Loop," IEEE Journal of Solid-State Circuits, May 2009, pp. 1391-1400, vol. 44, No. 5, IEEE.

Seojin Choi et al., "A 185-$fs_{rms}$-Integrated-Jitter and -245dB FOM PVT-Robust Ring-VCO-Based Injection-Locked Clock Multiplier with a Continuous Frequency-Tracking Loop Using a Replica-Delay Cell and a Dual-Edge Phase Detector," 2016 IEEE International Solid-State Circuits Conference (ISSCC), Feb. 2, 2016, pp. 194-195, IEEE.

Jri Lee et al., "Study of Subharmonically Injection-Locked PLLs," IEEE Journal of Solid-State Circuits, May 2009, pp. 1539-1553. vol. 44, No. 5, IEEE.

Ahmed Elkholy et al., "Design and Analysis of Low-Power High-Frequency Robust Sub-Harmonic Injection-Locked Clock Multipliers," IEEE Journal of Solid-State Circuits, Dec. 2015, pp. 3160-3174, vol. 50, No. 12, IEEE.

Dustin Dunwell et al., "Modeling Oscillator Injection Locking Using the Phase Domain Response," IEEE Transactions on Circuits and Systems—I:Regular Papers, Nov. 2013, pp. 2823-2833, vol. 60, No. 11, IEEE.

Sung-Yong Cho et al., "A 5-GHz Subharmonically Injection-Locked All-Digital PLL with Complementary Switched Injection," 2015—41st European Solid-State Circuits Conference (ESSCIRC), 2015, pp. 384-387, IEEE.

Paolo Maffezzoni et al.: 'Phase Noise of Pulse Injection-Locked Oscillators', IEEE Transactions on Circuits and Systems—I:Regular Papers, Oct. 2014, pp. 2912-2919, vol. 61, No. 10, IEEE.

Ahmed Musa et al., "A Low Phase Noise Quadrature Injection Locked Frequency Synthesizer for MM-Wave Applications," IEEE Journal of Solid-State Circuits, Nov. 2011, pp. 2635-2649, vol. 46, No. 11, IEEE.

Nicola Da Dalt, "An Analysis of Phase Noise in Realigned VCOs," IEEE Transactions on Circuits and Systems—II: Express Briefs, Mar. 2014, pp. 143-147, vol. 61, No. 3, IEEE.

Yi-Chieh Huang et al., "A 2.4-GHz Subharmonically Injection-Locked PLL With Self-Calibrated Injection Timing," IEEE Journal of Solid-State Circuits, Feb. 2013, pp. 417-428, vol. 48, No. 2, IEEE.

Hsieh-Hung Hsieh et al., "A V-Band Divide-by-Three Differential Direct Injection-Locked Frequency Divider in 65-nm CMOS," Proc. IEEE CICC , Sep. 2010, pp. 1-4, IEEE.

Ming-Wei Li et al., "Low-Voltage, Wide-Locking-Range, Millimeter-Wave Divide-by-5 Injection-Locked Frequency Divider", IEEE Transactions on Microwave Theory and Techniques, Mar. 2012, pp. 679-685, vol. 60, No. 3, IEEE.

* cited by examiner

US 10,284,211 B2

INJECTION-LOCKED OSCILLATOR AND SEMICONDUCTOR DEVICE INCLUDING THE SAME

CROSS-REFERENCE TO RELATED APPLICATION

The present application claims priority to Korean Patent Application No. 10-2016-0076972, filed on Jun. 21, 2016, which is incorporated herein by reference in its entirety.

BACKGROUND

1. Field

Embodiments of the present disclosure relate to an injection-locked oscillator and a semiconductor device including the same.

2. Description of the Related Art

A technique has been developed in which a pulse is generated from a reference signal and injected to an injection-locked oscillator, so that the injection-locked oscillator provides an output signal whose frequency is a multiple of a frequency of the reference signal.

The conventional injection-locked oscillator uses a pulse generating circuit, and thus the whole circuit of the conventional injection-locked oscillator becomes complicated.

In addition, since the conventional injection-locked oscillator performs pulse injection during a short pulse width, an amount of injection current may be insufficient and a locking range may be limited.

In an injection-locked oscillator, when a locking range is narrow, a jitter tracking bandwidth is reduced, and thus jitter or phase noise increases.

Accordingly, there is a demand for an injection-locked oscillator in which a locking range is extended and whose circuit is simple.

There is also a demand for a semiconductor device that includes such an injection-locked oscillator, thereby reducing jitter.

SUMMARY

Various embodiments are directed to an injection-locked oscillator having a wide locking range without using a pulse generating circuit, and to a semiconductor device including the injection-locked oscillator, thereby reducing jitter.

In an embodiment, an injection-locked oscillator may include an oscillator including a first oscillation node through which a first oscillation signal is output and a second oscillation node through which a second oscillation signal is output, the second oscillation signal having a phase opposite to a phase of the first oscillation signal; and an injection circuit configured to provide an injection current between the first oscillation node and the second oscillation node according to a reference signal, wherein the injection circuit includes a charging element configured to be charged or discharged in response to the reference signal and to provide the injection current between the first oscillation node and the second oscillation node.

In an embodiment, a semiconductor device may include an injection-locked oscillator configured to provide an injection current according to an injection signal induced from a reference signal and to provide an output signal, a frequency of the output signal being controlled by a first bias control signal; a pulse width comparator configured to compare, during a first feedback control operation, a first pulse width of the output signal during a first period where the injection current is provided with a second pulse width of the output signal during a second period where the injection current is absent, and to output a pulse width comparison signal; and a first filter configured to control the first bias control signal according to the pulse width comparison signal output from the pulse width comparator during the first feedback control operation.

DETAILED DESCRIPTION

Hereafter, various embodiments will be described below in more detail with reference to the accompanying drawings.

Figure 1:
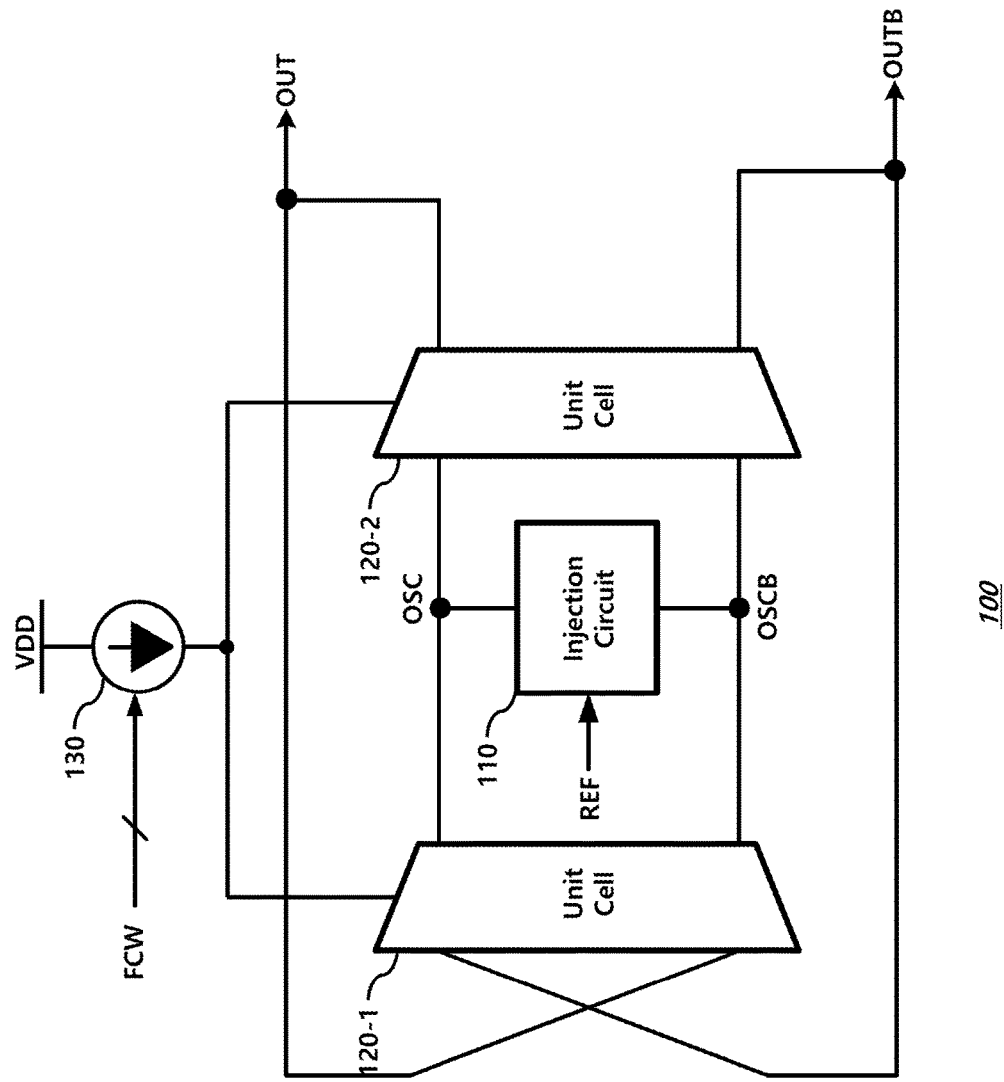
FIG. 1 is a block diagram of an injection-locked oscillator according to an embodiment of the present disclosure.

FIG. 1 is a block diagram of an injection-locked oscillator 100 according to an embodiment of the present disclosure.

Referring to FIG. 1, the injection-locked oscillator 100 includes a plurality of unit cells 120-1 and 120-2, an injection circuit 110, and a current source 130.

In this embodiment, the plurality of unit cells 120-1 and 120-2 are connected to each other in a ring structure, and generate output signals OUT and OUTB that have opposite phases.

Hereinafter, the output signal OUT is denoted by a first output signal, and the output signal OUTB is denoted by a second output signal.

FIG.1 shows the injection-locked oscillator 100 including the two unit cells 120-1 and 120-2, but the number of unit cells included in the injection-locked oscillator 100 may vary according to embodiments.

For illustrative convenience, in this embodiment, signals transmitted between the two unit cells 120-1 and 120-2 are represented by oscillation signals OSC and OSCB.

Hereinafter, the oscillation signals OSC and OSCB are denoted as a first oscillation signal OSC and a second oscillation signal OSCB. Referring to FIG. 1, because the unit cells 120-1 and 120-2 are connected to each other in the ring structure, the first and second oscillation signals OSC and OSCB outputted from the unit cell 120-1 are inputted to the unit cell 120-2, and the first and second output signals OUT and OUTB outputted from the unit cell 120-2 are inputted to the unit cell 120-1.

Figure 2:
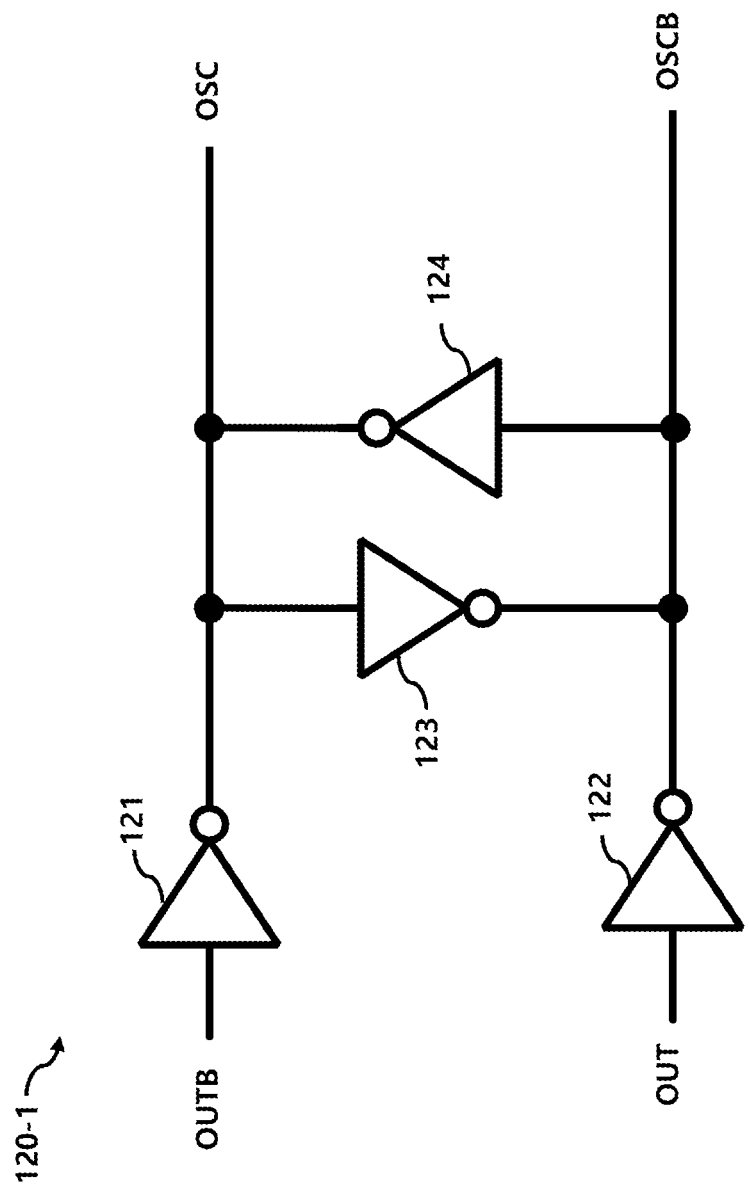
FIG. 2 is a circuit diagram of a unit cell of FIG. 1 according to an embodiment of the present disclosure.

FIG. 2 illustrates a circuit diagram of the unit cell 120-1 of FIG. 1 according to an embodiment of the present disclosure.

The unit cell 120-1 includes inverters 121 to 124. The inverter 121 inverts a second output signal OUTB and outputs a first oscillation signal OSC. The inverter 122 inverts a first output signal OUT and outputs a second oscillation signal OSCB. The inverters 123 and 124 are connected to output terminals of the inverters 121 and 122 in a latch structure.

Although not shown, in an embodiment, the unit cell 120-2 includes the same configuration as the unit cell 120-1, illustrated in FIG. 2.

Referring back to FIG. 1, the injection circuit 110 is connected between a first oscillation node, from which the first oscillation signal OSC is outputted, and a second oscillation node, from which the second oscillation signal OSCB is outputted. The injection circuit 110 provides an injection current between the first oscillation node and the second oscillation node according to a reference signal REF to thereby shift phases of the first and second oscillation signals OSC and OSCB and phases of the first and second output signals OUT and OUTB, resulting in an injection locking phenomenon.

The embodiment illustrated in FIG. 1 shows the injection circuit 110 that is applied to the injection-locked oscillator 100 including the plurality of unit cells 120-1 and 120-2, which are connected to each other in the ring structure. As a result, the injection is performed between the two oscillation signals OSC and OSCB that are generated by the plurality of unit cells 120-1 and 120-2. However, embodiments are not limited thereto.

In other embodiments, the injection circuit 110 may be applied to other types of oscillators, such as inductor-capacitor (LC) oscillators, which output differential oscillation signals.

Figure 3:
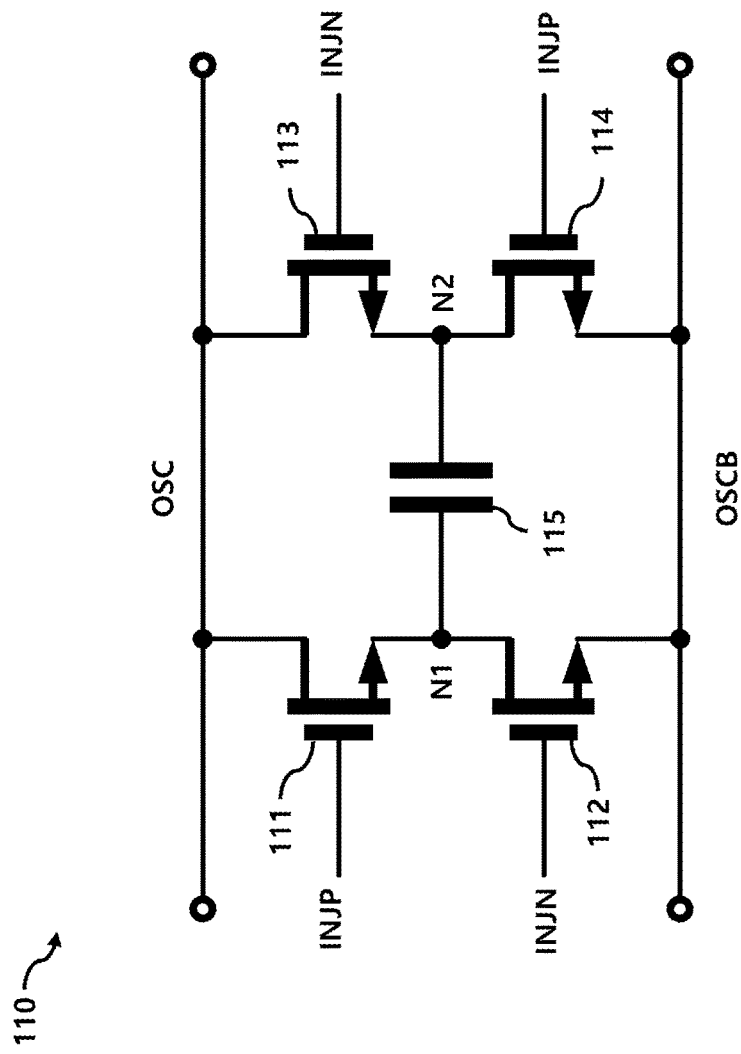
FIG. 3 is a circuit diagram of an injection circuit of FIG. 1 according to an embodiment of the present disclosure.

FIG. 3 illustrates a circuit diagram of the injection circuit 110 of FIG. 1 according to an embodiment of the present disclosure.

Referring to FIG. 3, the injection circuit 110 includes a charging element and a switching circuit. The switching circuit includes a first switch 111 and a second switch 112, which are connected in series between the first oscillation node and the second oscillation node, and further includes a third switch 113 and a fourth switch 114, which are connected in series between the first oscillation node and the second oscillation node.

The injection circuit 110 includes a first node N1 that is a common node between the first switch 111 and the second switch 112, a second node N2 that is a common node of the third switch 113 and the fourth switch 114. The charging element includes a capacitor 115 connected between the first node N1 and the second node N2.

The first switch 111 and the fourth switch 114 are controlled by a first injection signal INJP, and the second switch 112 and the third switch 113 are controlled by a second injection signal INJN.

In this embodiment, the first injection signal INJP and the second injection signal INJN are generated by adjusting a duty ratio of the reference signal REF to 1:1, and frequencies of the first and second injection signals INJN and INJP are equal to a frequency of the reference signal REF.

In this embodiment, the second injection signal INJN has a phase opposite to that of the first injection signal INJP.

Therefore, when the duty ratio of the reference signal REF is 1:1, the reference signal REF has substantially the same phase as one of the first injection signal INJP and the second injection signal INJN.

In the present embodiment, the first to fourth switches 111 to 114 may be implemented with NMOS transistors.

In FIG. 3, the injection circuit 110 applies an injection current between the first oscillation node and the second oscillation node in response to the first injection signal INJP and the second injection signal INJN, which are derived from the reference signal REF.

Figure 4:
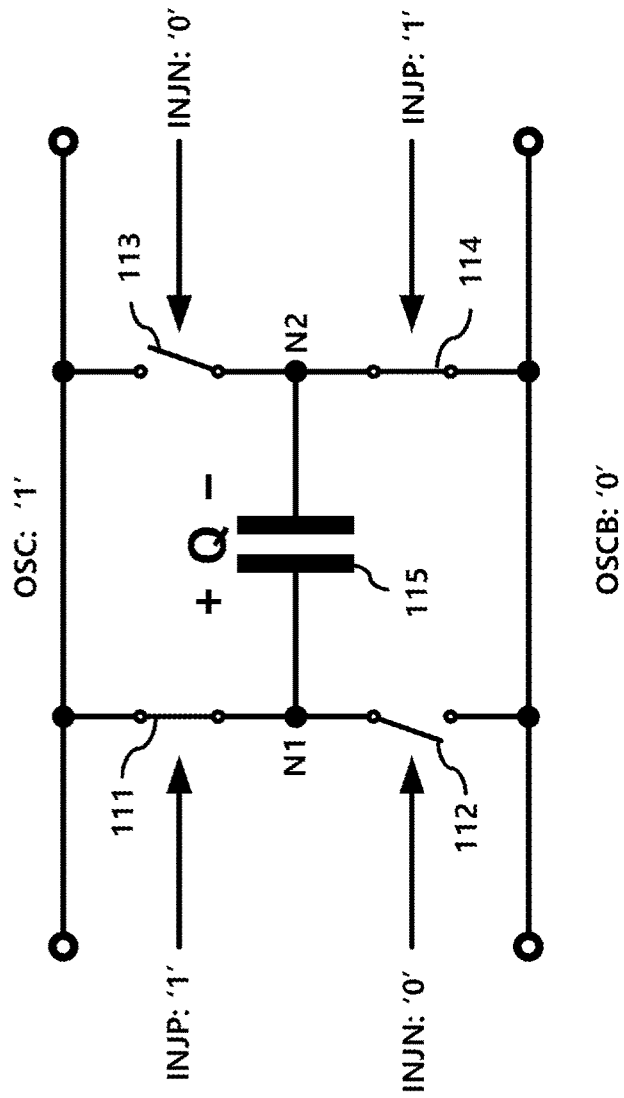
FIGS. 4 and 5 are diagrams for explaining an operation of the injection circuit of FIG. 3.
Figure 5:
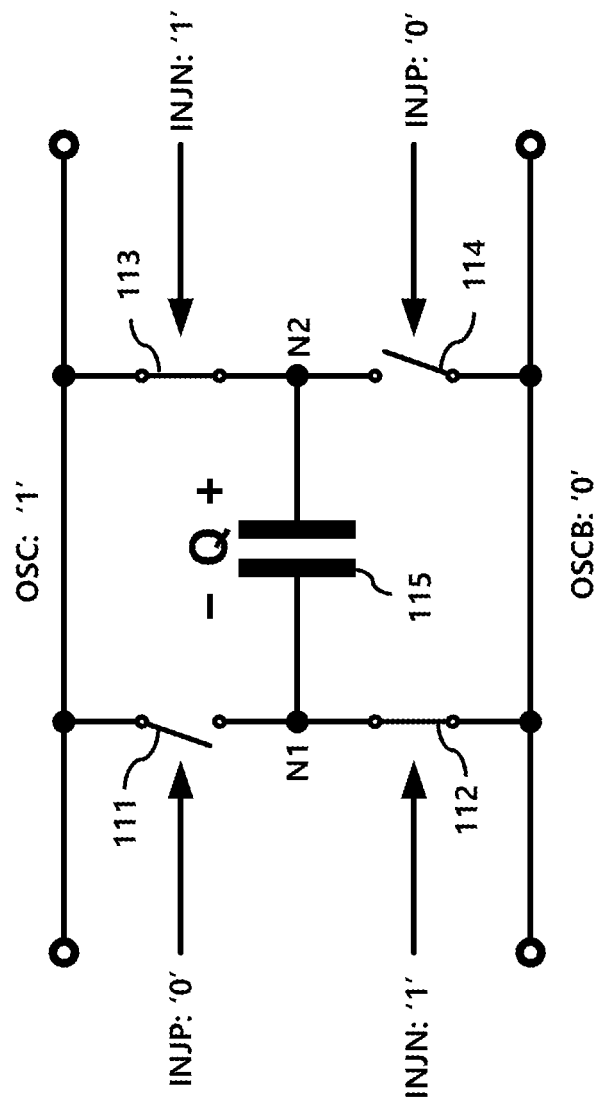

FIGS. 4 and 5 are diagrams for explaining an operation of the injection circuit 110 of FIG. 3.

In FIGS. 4 and 5, it is assumed that the first oscillation signal OSC has a logic value of "1," and the second oscillation signal OSCB has a logic value of "0."

Referring to FIG. 4, when the first injection signal INJP has a logic value of "1" and the second injection signal INJN has a logic value of "0," the first switch 111 and the fourth switch 114 are turned on, and the second switch 112 and the third switch 113 are turned off.

At this time, the capacitor 115 is charged with the charge Q. The first node N1 has a positive polarity and the second node N2 has a negative polarity.

Referring to FIG. 5, when the first injection signal INJP has a logic value of "0" and the second injection signal INJN has a logic value of "1," the first switch 111 and the fourth switch 114 are turned off, and the second switch 112 and the third switch 113 are turned on.

At this time, the capacitor 115 is charged with the charge Q. The first node N1 has a negative polarity, and the second node N2 has a positive polarity.

That is, when the first injection signal INJP transitions from the logic value of "1" to the logic value of "0," the charge stored in the capacitor 115 changes from +Q to −Q.

In this process, an instantaneous injection current Ic flows between the first node N1 and the second node N2 across the capacitor 115.

The magnitude of the injection current is proportional to the capacitance of the capacitor 115.

Figure 7:
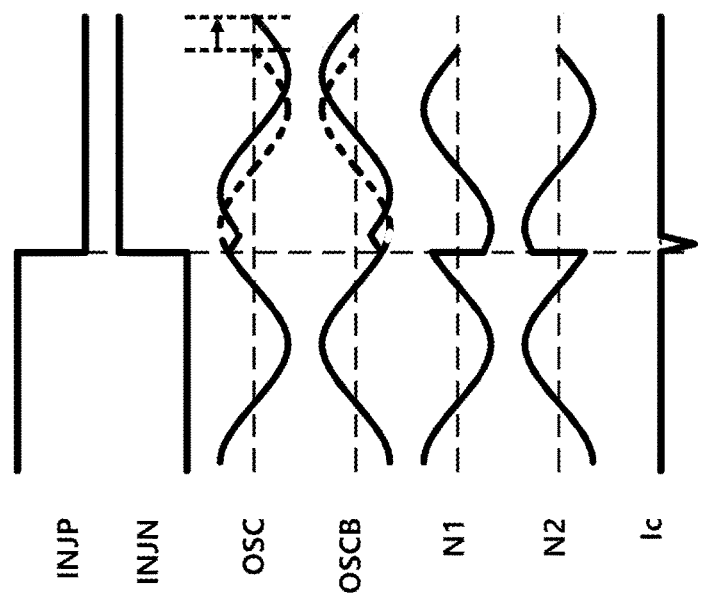

In particular, when a direction of the injection current Ic flowing from the first node N1 to the second node N2 is denoted as a positive direction, a negative injection current Ic flows instantaneously when the first injection signal INJP transitions from the logic value of "1" to the logic value of "0," as shown in FIG. 7.

FIGS. 4 and 5 show a case where the first oscillation signal OSC has the logic value of "1" and the second oscillation signal OSCB has the logic value of "0."

Figure 8:
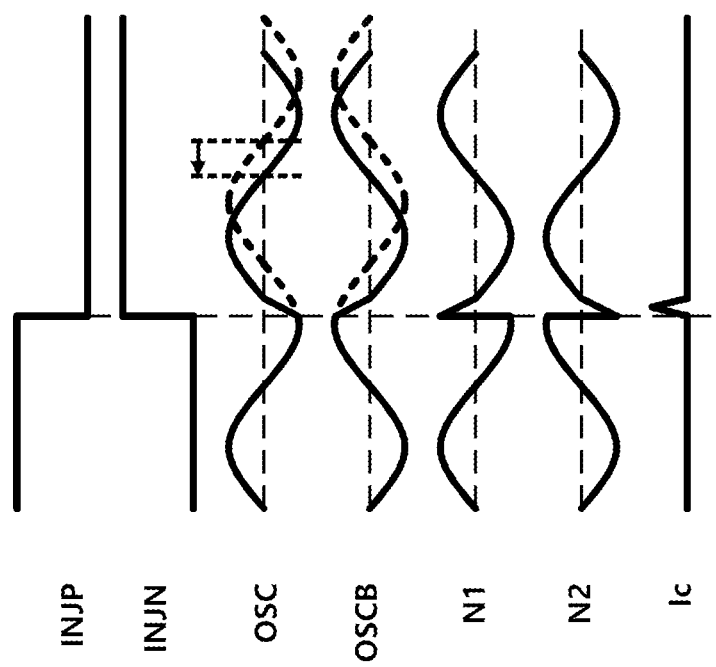

Therefore, if the first oscillation signal OSC has the logic value of "0" and the second oscillation signal OSCB has a logic value of "1," a positive injection current Ic flows instantaneously when the first injection signal INJP transitions from the logic value of "1" to the logic value of "0," as shown in FIG. 8.

In this manner, the injection current Ic corresponding to each transition of the reference signal REF is applied between the first oscillation node and the second oscillation node.

In the embodiment, since the injection current Ic is proportional to the capacitance of the capacitor 115, it is possible to increase a locking range by increasing the capacitance of the capacitor 115.

Figure 6:
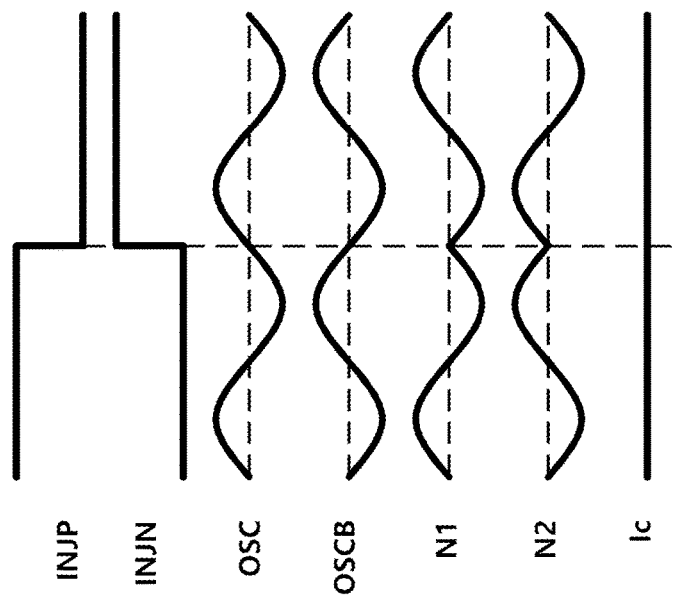
FIGS. 6 to 8 are timing diagrams for explaining an operation of the injection-locked oscillator of FIG. 1.

FIGS. 6 to 8 are timing diagrams for explaining an operation of the injection-locked oscillator 100 of FIG. 1.

More specifically, FIGS. 6 to 8 show the phase change of the injection current Ic and the oscillation signal OSC according to the magnitude of the oscillation signal OSC at a transition point of the first injection signal INJP.

FIG. 6 shows a case where voltages of the first oscillation signal OSC and the second oscillation signal OSCB are identical to each other at the transition point of the first injection signal INJP.

In this case, since voltages at the first and second nodes N1 and N2 corresponding to both ends of the capacitor 115 have the same level, the capacitor 115 is not charged, and thus the magnitude of the injection current Ic becomes zero at the transition point of the first injection signal INJP.

The first node N1 has the same voltage level as the first oscillation signal OSC while the first switch 111 is turned on, and has the same voltage level as the second oscillation signal OSCB while the second switch 112 is turned on.

The second node N2 has the same voltage level as the first oscillation signal OSC while the third switch 113 is turned on, and has the same voltage level as the second oscillation signal OSCB while the fourth switch 114 is turned on.

Accordingly, the first node N1 has substantially the same waveform as the first oscillation signal OSC when the first injection signal INJP has the logic value of "1," and has substantially the same waveform as the second oscillation signal OSCB when the first injection signal INJP has the logic value of "0."

The second node N2 has substantially the same waveform as the second oscillation signal OSCB when the first injection signal INJP has the logic value of "1," and has substantially the same waveform as the first oscillation signal OSC when the first injection signal INJP has the logic value of "0."

FIG. 7 shows a case in which the first oscillation signal OSC has the logic value of "1" during the transition of the first injection signal INJP, as shown in FIGS. 4 and 5.

The injection current Ic flows through the third switch 113, the second node N2, the first node N1, and the second switch 112 when the first injection signal INJP transitions from the logic value of "1" to the logic value of "0." That is, the negative injection current Ic flows during the transition of the first injection signal INJP.

Accordingly, during the transition of the first injection signal INJP, the voltage of the first oscillation signal OSC instantaneously decreases, and the voltage of the second oscillation signal OSCB instantaneously increases.

As a result, phases of the first oscillation signal OSC and the second oscillation signal OSCB increase or are pushed due to the negative injection current Ic.

The voltage of the first node N1 is substantially equal to the voltage of the first oscillation signal OSC before the transition, and is substantially equal to the voltage of the second oscillation signal OSCB after the transition.

The voltage of the second node N2 is substantially equal to the voltage of the second oscillation signal OSCB before the transition, and is substantially equal to the voltage of the first oscillation signal OSC after the transition.

FIG. 8 shows a case where the first oscillation signal OSC has the logic value of "0" when the first injection signal INJP transitions from the logic value of "1" to the logic value of "0."

The injection current Ic flows through the second switch 112, the first node N1, the second node N2, and the third switch 113 while the first injection signal INJP transitions from the logic value of "1" to the logic value of "0." That is, the positive injection current Ic flows during the transition of the first injection signal INJP.

Accordingly, during the transition of the first injection signal INJP, the voltage of the first oscillation signal OSC instantaneously increases, and the voltage of the second oscillation signal OSCB instantaneously decreases.

As a result, phases of the first oscillation signal OSC and the second oscillation signal OSCB decrease or are pulled due to the positive injection current Ic.

The voltage of the first node N1 is substantially equal to the voltage of the first oscillation signal OSC before the transition, and is substantially equal to the voltage of the second oscillation signal OSCB after the transition.

The voltage of the second node N2 is substantially equal to the voltage of the second oscillation signal OSCB before the transition, and is substantially equal to the voltage of the first oscillation signal OSC after the transition.

If the frequency of the output signal OSC is denoted as 'f' and the frequency of the reference signal REF is denoted as '$f_{ref}$,' the relation between the frequencies of the output signal OSC and the reference signal REF may be expressed as follows:

$$f = N * f_{ref} \qquad \text{Equation 1}$$

where N is an integer representing an actual multiplication ratio or a frequency division ratio.

While pulling or pushing the phase of the output signal OSC by the reference signal REF proceeds as shown in FIGS. 7 and 8, if the frequency of the output signal OSC is maintained as a multiple of the frequency of the reference signal REF, an injection-locking may be considered to be obtained.

Figure 9:
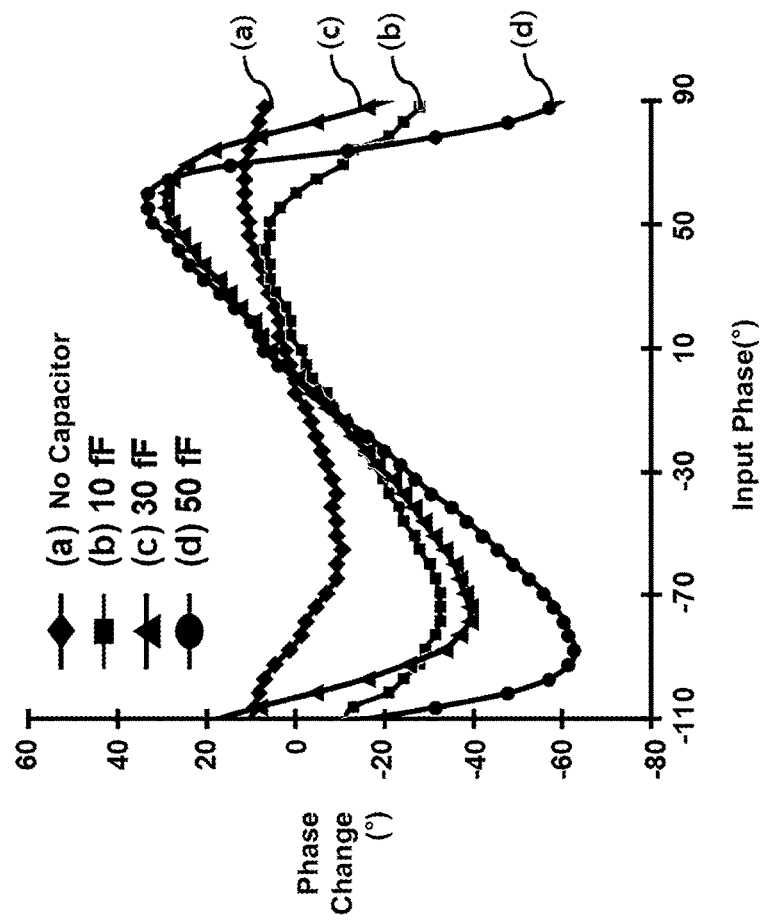
FIGS. 9 and 10 are graphs showing simulation results of the injection-locked oscillator of FIG. 1.
Figure 10:
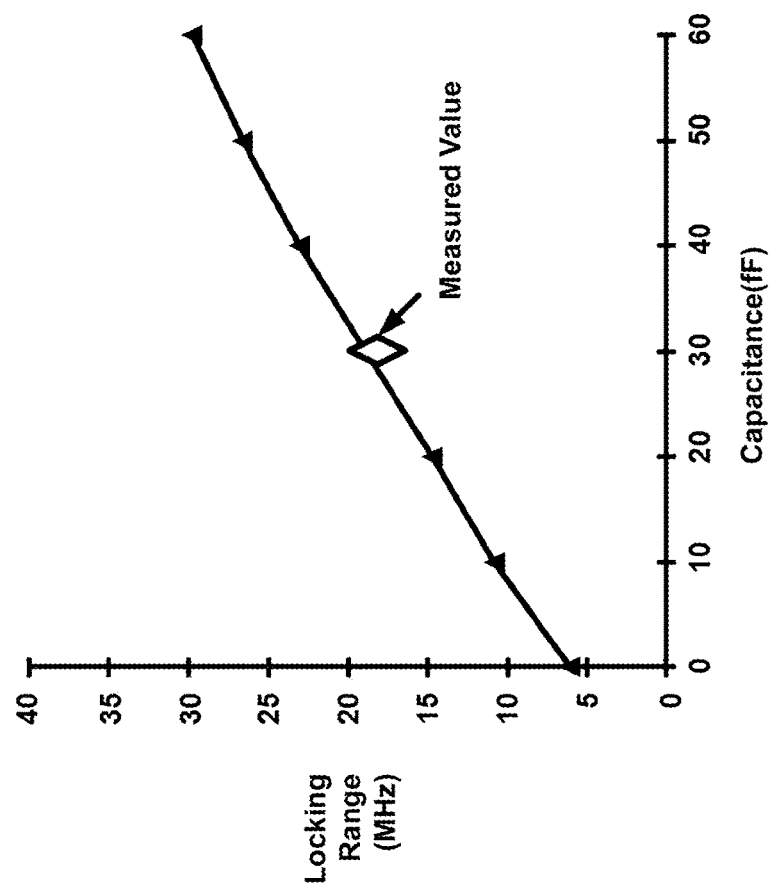

FIGS. 9 and 10 are graphs showing simulation results for the injection-locked oscillator of FIG. 1.

FIG. 9 represents a graph obtained by performing PDR (Phase Domain Response) simulation. In FIG. 9, 'Input Phase' represents an initial phase difference between the reference signal REF and the output signal OSC, and 'Phase Change' represents a phase change of the output signal OSC relative to its initial phase.

As shown in the graph of FIG. 9, the phase change of the output signal OSC oscillates according to the input phase.

It is known that Equation 2 may be established when the interval between upper and lower peaks is P in the graph obtained by the PDR simulation.

$$\Delta f_{max} = \frac{f_0 P}{2\pi M}, \qquad \text{[Equation 2]}$$

where M is a natural number representing an effective multiplication ratio, $f_0$ is a free running frequency of the injection-locked oscillator 100 in the absence of injection, and $\Delta f_{max}$ is a locking range. The effective multiplication ratio M is given by the actual multiplication ratio N divided by a number of injections per cycle of the reference signal REF.

The locking range $\Delta f_{max}$ of Equation 2 is determined based on a difference between a maximum value and a minimum value of a frequency of the reference signal REF at which the injection-locking is possible.

If the frequency of the reference signal REF is out of this range, the injection locking does not occur.

It can be seen from Equation 2 that, as the interval P is increased for a certain number M, the locking range $\Delta f_{max}$ becomes larger.

As described in FIG. 9, the interval P between the upper and lower peaks of the phase change increases when the capacitor 115 is present, as compared with a case (a), where the capacitor 115 is absent, and the interval P increases as the capacitance of the capacitor 115 increases in the order of cases (b), (c), and (d).

Accordingly, the graph shows that the locking range $\Delta f_{max}$ can increase by using the injection circuit 110, which includes the capacitor 115 and the switches 111 to 114, as illustrated in FIG. 3.

FIG. 10 is a graph showing a relationship between a locking range and the capacitance of the capacitor 115. FIG. 10 shows that the locking range decreases as the capacitance of the capacitor 115 decreases.

A measured value in FIG. 10 corresponds to a locking range measured at an injection-locked oscillator, which includes the capacitor 115 having the capacitance of 30 fF.

FIG. 10 shows that the measured locking range conforms with the simulation result shown in FIG. 9. The measured locking range is 17.25 MHz and the simulation locking range is 18.92 MHz. The simulation is performed considering a design where $f_0$=3.328 GHz, $C_{cs}$, which is the capacitance of the capacitor 115, is 30 fF, and the effective multiplication ratio M is 32, which is one-half of the actual multiplication ratio N that is 64. The value of P, which is earned by a simulation, is 65.5°.

Figure 11:
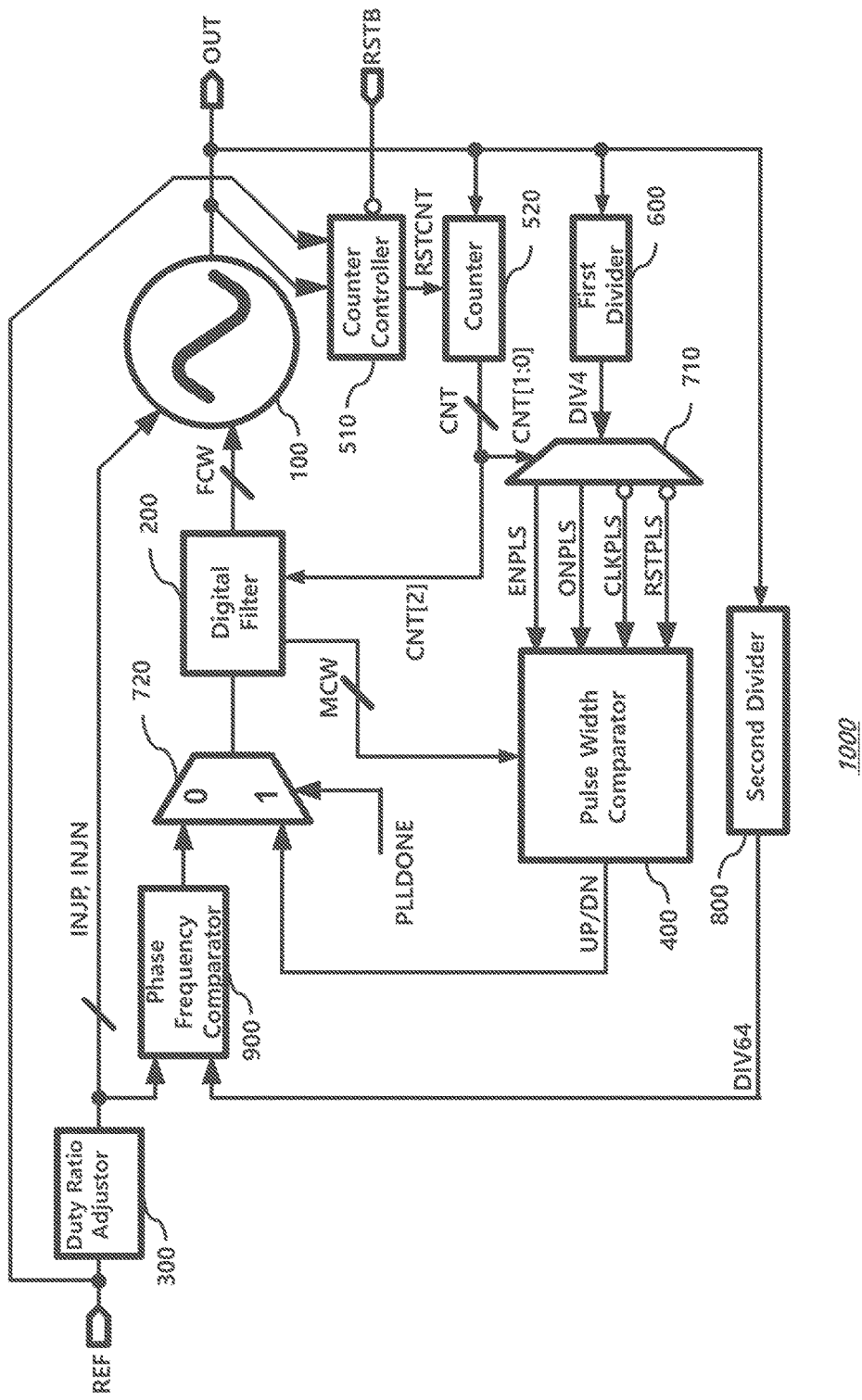
FIG. 11 is a block diagram of a semiconductor device according to an embodiment of the present disclosure.

FIG. 11 is a block diagram of a semiconductor device 1000 according to an embodiment of the present disclosure.

The semiconductor device 1000 includes the injection-locked oscillator 100 shown in FIG. 1, and outputs an output signal OUT. A frequency of the output signal OUT is N (=64) times a frequency of the reference signal REF.

The semiconductor device 1000 includes the injection-locked oscillator 100, a digital filter 200, a duty ratio adjustor 300, a pulse width comparator 400, a counter controller 510, a counter 520, a first divider 600, a first selector 710, a second selector 720, a second divider 800, and a phase frequency comparator 900.

The semiconductor device 1000 may include a phase locked loop for placing the frequency of the output signal OUT of the injection-locked oscillator 100 to a value close to a target value of the frequency of the output signal OUT before an injection locking operation is performed. The target value may be $N \times f_{ref}$, where $f_{ref}$ is the frequency of the reference signal REF.

At the beginning of an operation of the semiconductor device 1000, a phase locking control signal PLLDONE is disabled, so that a phase locking operation is performed.

The phase locked loop includes the phase frequency comparator 900, the digital filter 200, the injection-locked oscillator 100, and the second divider 800.

In this embodiment, a frequency division ratio of the second divider 800 is set to 64, i.e., N is 64, which is a reference value for determining the target value of the frequency of the output signal OUT.

The phase frequency comparator 900 compares a phase and a frequency of a first injection signal INJP corresponding to the duty ratio corrected reference signal REF to a phase and frequency of each of a second division signal DIV64 output from the second divider 800.

The second selector 720 selects an output of the phase frequency comparator 900, and provides it to the digital filter 200 when the phase locking control signal PLLDONE is disabled to, e.g., a logic value of "0".

The digital filter 200 outputs a first bias control signal FCW according to the output of the phase frequency comparator 900.

The injection-locked oscillator 100 adjusts a bias current provided by the current source 130 in FIG. 1 according to the first bias control signal FCW, and thereby adjusts the frequency of the output signal OUT.

The pulse width comparator 400, the counter controller 510, the counter 520, the first divider 600, and the first selector 710 may be disabled until the phase locking operation is completed.

When the phase locking operation is completed, the phase locking control signal PLLDONE is activated to, e.g., a logic value of "1."

After the phase locking operation is completed, the second selector 720 provides the digital filter 200 with a pulse width comparison signal UP/DN output from the pulse width comparator 400.

After the phase locking operation is completed, the semiconductor device 1000 controls the injection locking operation of the output signal OUT through the use of a feedback control operation.

The feedback control operation includes a first feedback control process for adjusting the bias current of the injection-locked oscillator 100.

In this embodiment, a second feedback control process for controlling the mismatch of the pulse width comparator 400 is additionally performed.

The bias current of the injection-locked oscillator 100 can be controlled by controlling the first bias control signal FCW in the first feedback control process.

In the present embodiment, a second bias control signal MCW is controlled in the second feedback control process to automatically adjust a bias current applied to the pulse width comparator 400.

This will be described in detail with reference to FIG. 13.

In the present embodiment, when the frequency division ratio of the second divider 800 is set to 64, the first feedback control process is performed for 16 cycles of the output signal OUT after the first injection signal INJP transitions from a logic value of "0" to a logic value of "1" or from the logic value of "1" to the logic value of "0," the second feedback control process is performed for 16 cycles before the first injection signal INJP transitions from the logic value of "1" to the logic value of "0" or from the logic value of "0" to the logic value of "1". The second feedback control process may follow the first feedback control process.

This will be described in detail with reference to FIG. 14.

Figure 12:
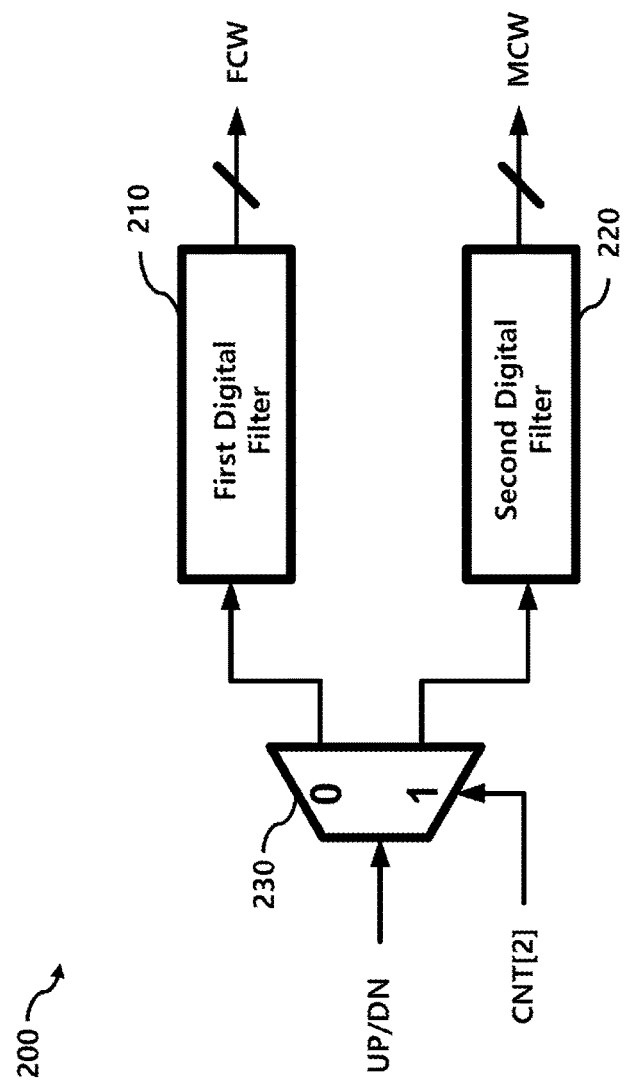
FIG. 12 is a block diagram of a digital filter of FIG. 11 according to an embodiment of the present disclosure.

FIG. 12 illustrates a block diagram of the digital filter 200 of FIG. 11 according to an embodiment of the present disclosure.

The digital filter 200 includes a first digital filter 210 performing a first feedback control operation to output a first bias control signal FCW and a second digital filter 220 performing a second feedback control operation to output a second bias control signal MCW.

The first digital filter 210 and the second digital filter 220 may be implemented using a conventional digital filter, which includes a sigma-delta modulator.

After a phase locking operation is completed, the pulse width comparison signal UP/DN output from the pulse width comparator 400 is applied to the first digital filter 210 and the second digital filter 220.

In the present embodiment, the first digital filter 210 outputs the first bias control signal FCW using the pulse width comparison signal UP/DN applied for 16 cycles of the output signal OUT after the first injection signal INJP transitions, and the second digital filter 220 outputs the second bias control signal MCW using the pulse width comparison signal UP/DN applied for 16 cycles of the output signal OUT before the first injection signal INJP transitions again.

To this end, in this embodiment, the digital filter 200 further includes a third selector 230 for selecting the first digital filter 210 or the second digital filter 220 in response to a counter signal CNT[2].

Referring back to FIG. 11, the counter 520 outputs a 3-bit counter signal CNT. A value of the counter signal CNT increases by one every four cycles of the output signal OUT at a rising edge of the output signal OUT.

The counter 520 repeats counting from 0 to 7 every 32 cycles of the output signal OUT.

While the counter 520 counts from 0 to 3, the first feedback control operation is performed, and the second feedback control operation is performed while the counter 520 counts from 4 to 7.

The lower 2 bits CNT[1:0] of the count signal CNT are provided to the first selector 710, and are used as a selection signal.

Accordingly, as the count value increases from 0 to 3 or increases from 4 to 7, a first divided signal DIV4 output from the first divider 600 is provided to the pulse width comparator 400 as a first pulse signal ENPLS, a second pulse signal ONPLS, a clock pulse signal CLKPLS, or a reset pulse signal RSTPLS.

At this time, the clock pulse signal CLKPLS and the reset pulse signal RSTPLS are obtained by inverting the first divided signal DIV4.

The first divider 600 outputs the first divided signal DIV4 that is obtained by dividing the output signal OUT by four.

The counter controller 510 outputs a counter reset signal RSTCNT for resetting the counter 520 in response to a reset signal RSTB, the reference signal REF, and the output signal OUT.

The counter controller 510 outputs the counter reset signal RSTCNT, which is a pulse signal rising when the reference signal REF transitions to a logic value of "1" in a state in which the reset signal RSTB is inactive with, e.g., a logic value of "1."

When the counter reset signal RSTCNT is activated with, e.g., a logic value of "1," the count signal CNT is reset to "000."

Figure 13:
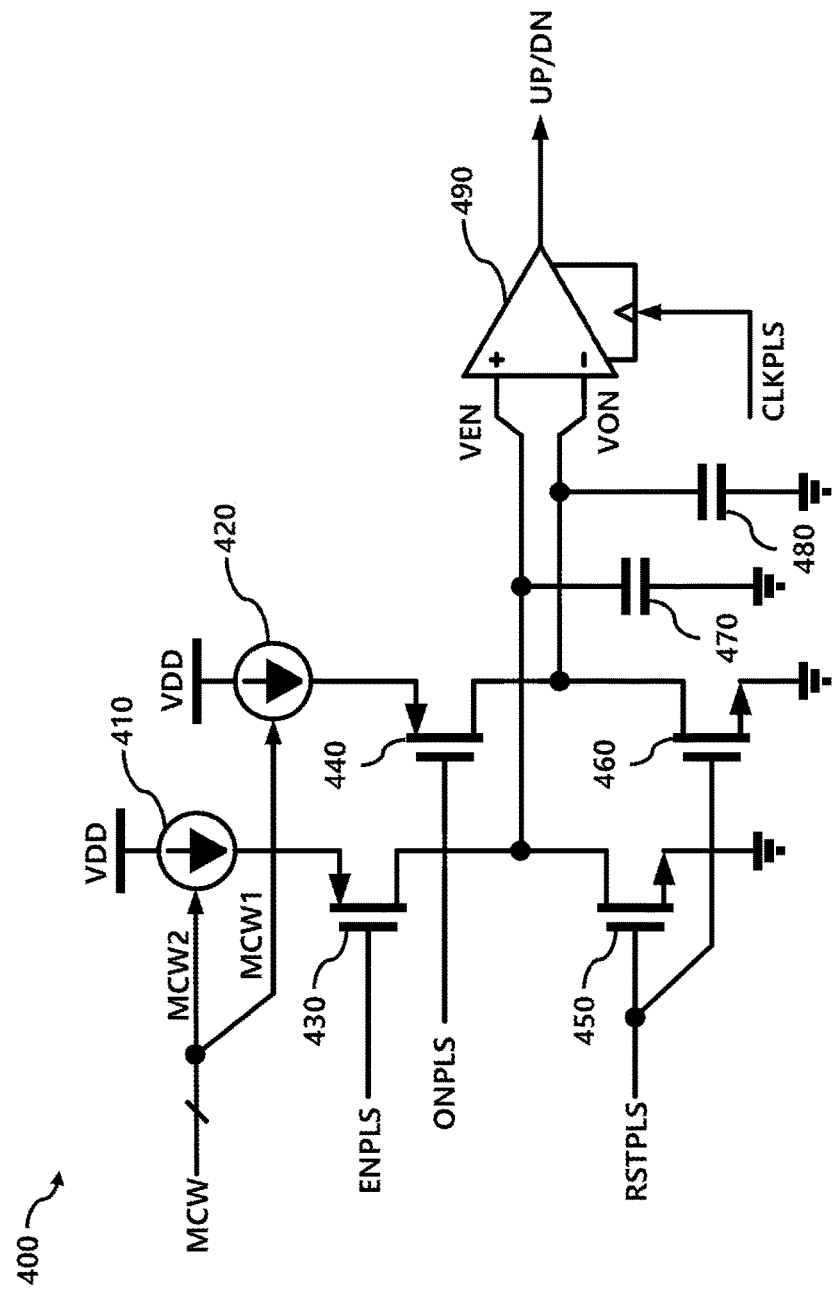
FIG. 13 is a circuit diagram of a pulse width comparator of FIG. 11 according to an embodiment of the present disclosure.

FIG. 13 is a circuit diagram of the pulse width comparator 400 of FIG. 11 according to an embodiment of the present disclosure.

The pulse width comparator 400 includes a first current source 410, a second current source 420, a first capacitor 470, a second capacitor 480, a first charge switch 430, a second charge switch 440, a first discharge switch 450, a second discharge switch 460, and a signal comparator 490.

The first current source 410 is controlled by a third bias control signal MCW2 of the second bias control signal MCW, and the second current source 420 is controlled by a fourth bias control signal MCW1 of the second bias control signal MCW.

The first charge switch 430 charges the first capacitor 470 in response to the first pulse signal ENPLS, and the second charge switch 440 charges the second capacitor 480 in response to the second pulse signal ONPLS.

The first discharge switch 450 discharges the first capacitor 470 in response to the reset pulse signal RSTPLS, and the second discharge switch 460 discharges the second capacitor 480 in response to the reset pulse signal RSTPLS.

The signal comparator 490 compares a first charge voltage VEN charged in the first capacitor 470 and a second charge voltage VON charged in the second capacitor 480 at a rising edge of the clock pulse signal CLKPLS, and outputs the pulse width comparison signal UP/DN.

It is desirable that first characteristics of the first current source 410, the first charge switch 430, the first discharge switch 450, and the first capacitor 470 are substantially the same as second characteristics of the second current source 420, the second charge switch 440, the second discharge switch 460, and the second capacitor 480, respectively.

However, a mismatch between the first characteristics and the second characteristics may occur due to various reasons such as a PVT variation in a manufacturing process. Therefore, due to the mismatch, the charging and discharging conditions of the first charging voltage VEN and the second charging voltage VON become different, and distortion of the pulse width comparison signal UP/DN may occur.

The distortion of the pulse width comparison signal UP/DN may result in an error in the first feedback control operation.

Accordingly, in this embodiment, the mismatch can be solved by adjusting a value of the second bias control signal MCW through the second feedback control operation. As a result, the first feedback control operation can be performed more accurately.

The operation of the semiconductor device of FIG. 11 will be described with reference to a timing diagram illustrated in FIG. 14.

Figure 14:
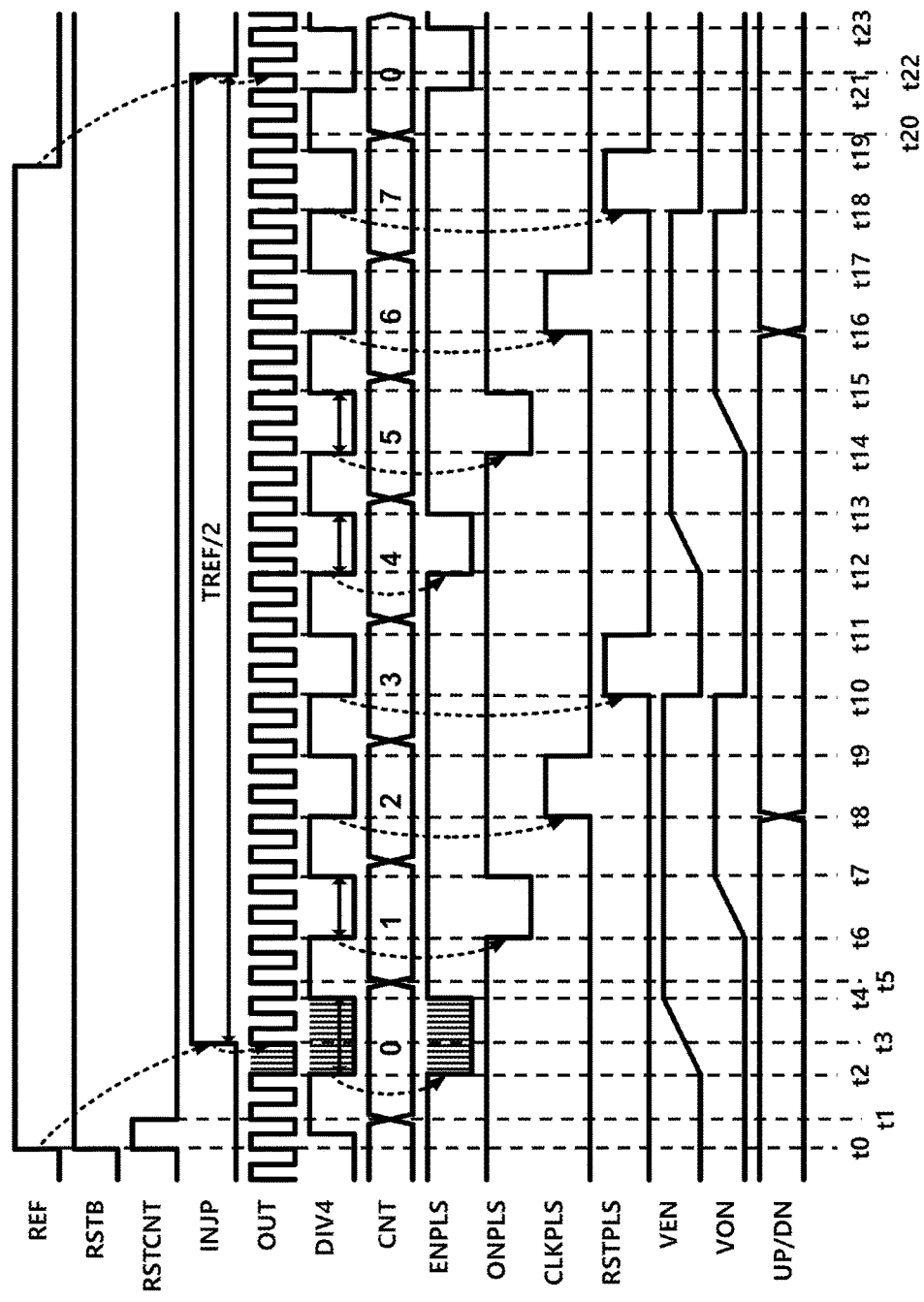
FIG. 14 is a timing diagram showing an operation of the semiconductor device of FIG. 11.

In the timing diagram of FIG. 14, it is assumed that an initial operation of a phase locked loop is completed and the phase locking signal PLLDONE is activated.

In this embodiment, the frequency of the output signal OUT at the time of injection locking completed is 64 times the frequency of the reference signal REF.

When the reference signal REF transitions from a logic value of "0" to a logic value of "1" in a state where the reset signal RSTB is inactivated at a time t0, the counter reset signal RSTCNT pulse having a logic level of "1" for one cycle of the output signal OUT is outputted.

Accordingly, the counter signal CNT is initialized to zero at a time t1.

The first selector 710 provides the first divided signal DIV4 to the pulse width comparator 400 as the first pulse signal ENPLS between the time t1 and a time t5 where the counter signal CNT is set to zero.

A duty ratio adjusting operation for the reference signal REF is completed at a time t3, and thus the first injection signal INJP starts to be outputted.

As described above with reference to FIGS. 7 and 8, the injection current flows during the transition of the first injection signal INJP, so that the phase of the output signal OUT is pulled forward or pushed backward.

The variation in a width between a time t2 and the time t3 of the output signal OUT occurs due to the influence of the injection current, and causes the variation in a width between the time t2 and a time t4 of the first divided signal DIV4.

Thus, the width between the time t2 and the time t4 of the first pulse signal ENPLS reflects a frequency change of the output signal OUT due to the injection current.

The first charge switch 430 of the pulse width comparator 400 is turned on to charge the first capacitor 470 during a period in which the first pulse signal ENPLS is in a low logic state. Therefore, the first charge voltage VEN reflects a time length of the first pulse signal ENPLS that is in the low logic state.

The first selector 710 provides the first divided signal DIV4 to the pulse width comparator 400 as the second pulse signal ONPLS in a period in which the counter signal CNT has a count value of 1 after it is increased to 1 at the time t5 after 4 cycles of the output signal OUT passed from the time t1.

A width between a time t6 and a time t7 of the second pulse signal ONPLS reflects the frequency of the output signal OUT in the absence of the injection current.

The second charge switch 440 of the pulse width comparator 400 is turned on to charge the second capacitor 480 during a period in which the second pulse signal ONPLS is in a low logic state. Therefore, the second charge voltage VON reflects a time period when the second pulse signal ONPLS is in the low logic state, i.e., the period from the time t6 to the time t7.

At a time t8, the first selector 710 inverts the first divided signal DIV4 to provide the clock pulse signal CLKPLS in a period in which the counter signal CNT has a count value of 2 after the counter value is increased to 2.

The signal comparator 490 of the pulse width comparator 400 compares the first charge voltage VEN with the second charge voltage VON, and outputs the first charge voltage VEN as the pulse width comparison signal UP/DN at a rising edge of the clock pulse signal CLKPLS.

The pulse width comparison signal UP/DN is output at the time t8, in which the clock pulse signal CLKPLS transitions to a logic value of "1."

At this time, the pulse width comparison signal UP/DN represents a difference between the target frequency 64 $f_{ref}$ and the frequency of the output signal OUT.

The pulse width comparison signal UP/DN is provided to the first digital filter 210 through the third selector 230 of FIG. 12 and the output signal OUT is adjusted according to the first bias control signal FCW output from the first digital filter 210.

After that, the first selector 710 inverts the first divided signal DIV4 to provide the reset pulse signal RSTPLS in a period in which the counter signal CNT has a count value of 3 after the counter value is increased to 3 after a time t9.

Accordingly, the first discharge switch 450 and the second discharge switch 460 are turned on during a period between a time t10 and a time t11, in which the reset pulse signal RSTPLS is in a high logic state. Accordingly, the first capacitor 470 and the second capacitor 480 are discharged and each of the first charging voltage VEN and the second charging voltage VON becomes zero.

The first selector 710 provides the first divided signal DIV4 to the pulse width comparator 400 as the first pulse signal ENPLS in a period between a time t12 and a time t13, in which the counter signal CNT has a counter value of 4 after the counter value is increased to 4 following the time t11.

The period between the time t12 and the time t13 of the first pulse signal ENPLS reflects the frequency of the output signal OUT in the absence of the injection current.

The first charge switch 430 of the pulse width comparator 400 is turned on to charge the first capacitor 470 during the period in which the first pulse signal ENPLS is in the low logic state. The first charging voltage VEN reflects the period when the first pulse signal ENPLS is in the low logic state.

After that, the first selector 710 provides the first dividing signal DIV4 to the pulse width comparator 400 as the second pulse signal ONPLS in a period between the time t14 and a time t15 in which the counter signal CNT has a counter value of 5 after the counter value is increased to 5 after a time t13.

The period between the time t14 and the time t15 of the second pulse signal ONPLS reflects the frequency of the output signal OUT in the absence of the injection current.

The second charge switch 440 of the pulse width comparator 400 is turned on to charge the second capacitor 480 during the period in which the second pulse signal ONPLS is in the low logic state. Therefore, the second charging voltage VON reflects the period where the second pulse signal ONPLS is in the low logic state.

At a time t16, the first selector 710 inverts the first divided signal DIV4 to provide the clock pulse signal CLKPLS in a period in which the counter signal CNT has a counter value of 6 after the counter value is increased to 6 after the time t15.

The signal comparator 490 of the pulse width comparator 400 compares the first charging voltage VEN with the second charging voltage VON, and outputs the comparison result as the pulse width comparison signal UP/DN at a rising edge of the clock pulse signal CLKPLS.

The pulse width comparison signal UP/DN is output at the time t16 when the clock pulse signal CLKPLS transitions to a logic value of "1."

At this time, the pulse width comparison signal UP/DN indicates a mismatch related to the generation of the first charging voltage VEN and the second charging voltage VON.

The pulse width comparison signal UP/DN is provided to the second digital filter 220 through the third selector 230 of FIG. 12 in response to the counter signal CNT[2] that has transitioned to a logic value of "1" when the counter signal CNT has the counter value of 4, and accordingly, a bias current of the first current source 410 and a bias current of the second current source 420 are adjusted according to the second bias control signal MCW output from the second digital filter 220.

Thus, the second feedback control operation reduces the mismatch associated with the generation of the first charging voltage VEN and the second charging voltage VON.

The first feedback control operation can be performed more accurately when the mismatch in the process of generating the first charging voltage VEN and the second charging voltage VON is reduced.

The first selector 710 inverts the first divided signal DIV4 to provide the reset pulse signal RSTPLS in a period in which the counter signal CNT has a counter value of 7 after the counter value is increased to 7 after a time t17.

Accordingly, the first discharge switch 450 and the second discharge switch 460 are turned on during a period between a time t18 and a time t19 when the reset pulse signal RSTPLS is in the high logic state, and accordingly the first capacitor 470 and the second capacitor 480 are discharged and each of the first charging voltage VEN and the second charging voltage VON becomes zero.

At a time t20, the counter value is reset to 0, and the first selector 710 outputs the first divided signal DIV4 to the pulse width comparator 400 as the first pulse signal ENPLS in the period in which the counter value is zero.

An injection current is generated by the first injection signal INJP, which transitions at a time t22 in a period between a time t21 and a time t23 where the first pulse signal ENPLS is in the low logic state.

Thereafter, the operation proceeds similarly as described above.

As described above, a frequency error correction process by the first feedback control operation and a mismatch correction process by the second feedback control operation are alternately performed.

Figure 15:
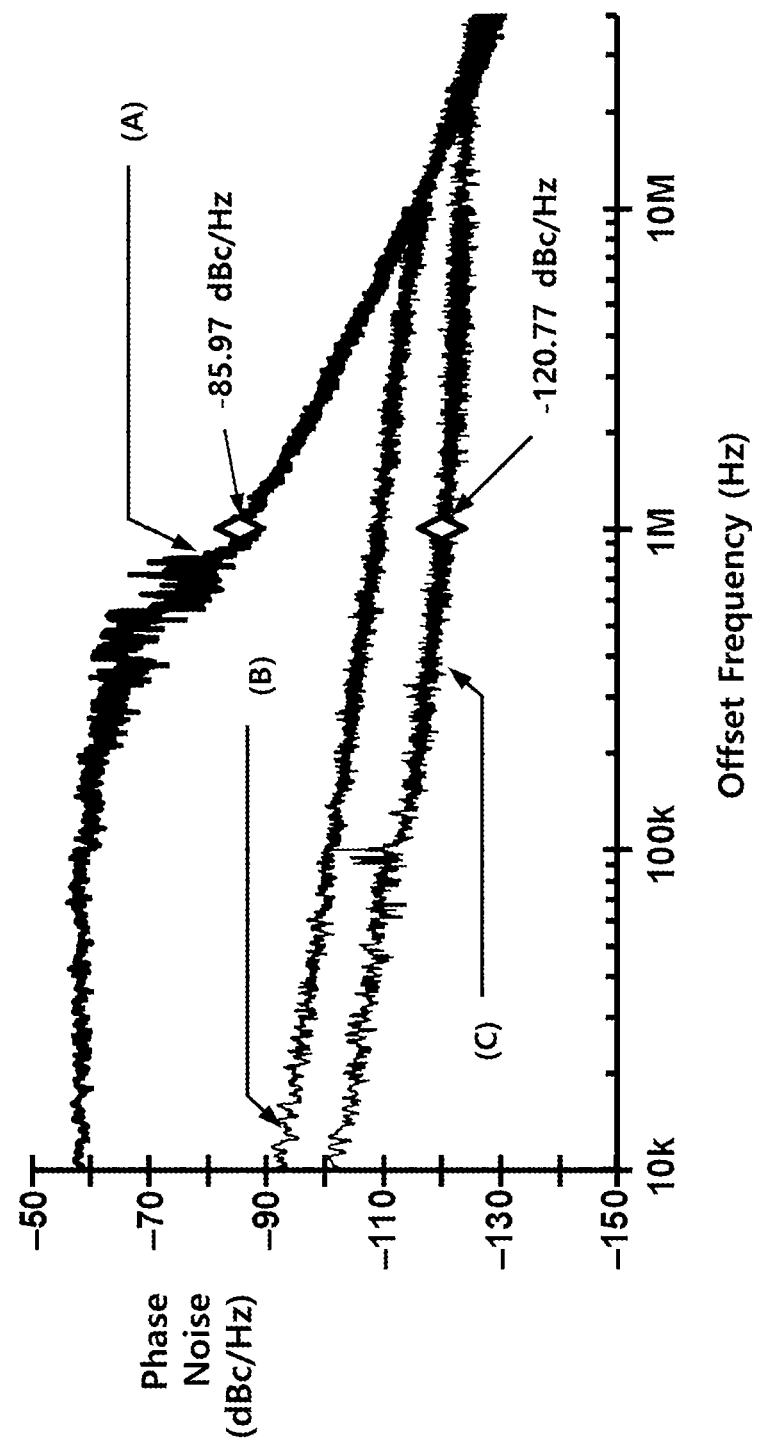
FIG. 15 is a graph showing the effect of an embodiment of the present disclosure.

FIG. 15 is a simulation graph showing the effect of an embodiment of the present disclosure, and shows a magnitude of phase noise according to an offset frequency.

In FIG. 15, the offset frequency represents a frequency deviation from the target frequency 64 $f_{ref}$, and the phase noise represents phase noise at a frequency corresponding to the frequency deviation.

Graph (A) shows phase noise of a conventional ring oscillator when injection locking is not performed in the injection-locked oscillator 100 of FIG. 1.

Graph (B) shows phase noise when a difference between the target frequency 64 $f_{ref}$ of the injection-locked oscillator 100 of FIG. 1 and a free running frequency $f_0$ of a ring oscillator is not zero.

Graph (C) shows phase noise of the semiconductor device of FIG. 11.

In the graph (C), the diamond mark indicates when the offset frequency is 1 MHz.

It can be seen from the graphs of FIG. 15 that the phase noise of the injection-locked oscillator according to the present disclosure is remarkably reduced as compared with the conventional ring oscillator.

Also, it can be seen that the semiconductor device further performing the feedback control operation as described with reference to FIGS. 11 to 14 improves a phase noise characteristic of an injection-locked oscillator.

Although various embodiments have been described for illustrative purposes, it will be apparent to those skilled in the art that various changes and modifications may be made without departing from the spirit and scope of the invention as defined in the following claims.

What is claimed is:

1. An injection-locked oscillator comprising:
   an oscillator including a first oscillation node through which a first oscillation signal is output and a second oscillation node through which a second oscillation signal is output, the second oscillation signal having a phase opposite to a phase of the first oscillation signal; and
   an injection circuit configured to provide an injection current between the first oscillation node and the second oscillation node according to a reference signal,
   wherein the injection circuit includes a charging element configured to be charged or discharged in response to the reference signal and to provide the injection current between the first oscillation node and the second oscillation node,
   wherein the injection circuit further comprises:
      a first switch and a second switch connected in series between the first oscillation node and the second oscillation node; and
      a third switch and a fourth switch connected in series between the first oscillation node and the second oscillation node, and
   wherein the charging element is connected between a first node where the first switch and the second switch are connected to each other and a second node where the third switch and the fourth switch are connected to each other.

2. The injection-locked oscillator of claim 1, wherein the oscillator is a ring oscillator.

3. The injection-locked oscillator of claim 2, further comprising:
   a current source configured to provide a bias current to the ring oscillator.

4. The injection-locked oscillator of claim 1, wherein the first switch and the fourth switch are controlled by a first injection signal induced from the reference signal, and
   wherein the second switch and the third switch are controlled by a second injection signal having a phase opposite to a phase of the first injection signal.

5. The injection-locked oscillator of claim 4, wherein the first injection signal is obtained by adjusting a duty ratio of the reference signal to 1:1.

6. The injection-locked oscillator of claim 1, wherein the charging element is a capacitor, and the first to fourth switches are NMOS transistors.

7. A semiconductor device comprising:
   an injection-locked oscillator configured to provide an injection current according to an injection signal induced from a reference signal, and to provide an output signal, a frequency of the output signal being controlled by a first bias control signal;
   a pulse width comparator configured to compare, during a first feedback control operation, a first pulse width of the output signal during a first period when the injection current is provided with a second pulse width of the output signal during a second period when the injection current is absent, and to output a pulse width comparison signal; and
   a first filter configured to output the first bias control signal according to the pulse width comparison signal output from the pulse width comparator during the first feedback control operation.

8. The semiconductor device of claim 7, wherein the pulse width comparator compares, during a second feedback control operation, a third pulse width of the output signal during a third period when the injection current is provided with a fourth pulse width of the output signal during a fourth period when the injection current is not provided, and outputs the pulse width comparison signal, and
   wherein the semiconductor device further comprises a second filter configured to output a second bias control signal according to the pulse width comparison signal output from the pulse width comparator during the second feedback control operation.

9. The semiconductor device of claim 8, wherein the pulse width comparator comprises:
   a first current source and a second current source;
   a first capacitor and a second capacitor;
   a first charge switch configured to charge the first capacitor by coupling the first capacitor and the first current source in response to a first pulse signal;
   a second charge switch configured to charge the second capacitor by coupling the second capacitor and the second current source in response to a second pulse signal;
   a signal comparator configured to compare a first charging voltage of the first capacitor and a second charging voltage of the second capacitor in response to a clock pulse signal; and
   a first discharge switch and a second discharge switch configured to discharge the first capacitor and the second capacitor, respectively, in response to a reset pulse signal.

10. The semiconductor device of claim 9, further comprising:
   a first divider configured to divide the output signal;
   a counter configured to perform a counting operation according to the output signal; and
   a first selector configured to output an output of the first divider or output a signal generated by inverting the output of the first divider, as one of the first pulse signal, the second pulse signal, the clock pulse signal, and the reset clock pulse signal, according to a counter value output from the counter.

11. The semiconductor device of claim 9, wherein the second filter outputs the second bias control signal to control the first current source or the second current source.

12. The semiconductor device of claim 7, further comprising a duty ratio adjustor configured to output the injection signal by adjusting a duty ratio of the reference signal.

13. The semiconductor device of claim 12, further comprising:
- a second divider configured to divide the output signal;
- a phase frequency comparator configured to compare a phase and a frequency of an output from the duty ratio adjustor with a phase and a frequency of an output from the second divider; and
- a second selector configured to output an output of the pulse width comparator or an output of the phase frequency comparator according to whether a phase locking operation is being performed,
- wherein the first filter is configured to output the first bias control signal according to the output of the phase frequency comparator when the phase locking operation is being performed.

14. The semiconductor device of claim 7, wherein the injection-locking oscillator comprises:
- an oscillator including a first oscillation node through which a first oscillation signal is output and a second oscillation node through which a second oscillation signal is output, the second oscillation signal having a phase opposite to a phase of the first oscillation signal; and
- an injection circuit configured to provide the injection current between the first oscillation node and the second oscillation node according to the injection signal, wherein the injection circuit includes a charging element configured to be charged or be discharged in response to the injection signal and to provide the injection current between the first oscillation node and the second oscillation node.

15. The semiconductor device of claim 14, wherein the oscillator is a ring oscillator.

16. The semiconductor device of claim 15, wherein the injection-locking oscillator further comprises:
- a current source configured to provide a bias current to the ring oscillator.

17. The semiconductor device of claim 14, wherein the injection circuit further comprises:
- a first switch and a second switch connected in series between the first oscillation node and the second oscillation node; and
- a third switch and a fourth switch connected in series between the first oscillation node and the second oscillation node, and
- wherein the charging element is connected between a first node where the first switch and the second switch are connected to each other and a second node where the third switch and the fourth switch are connected to each other.

18. The semiconductor device of claim 17, wherein the first switch and the fourth switch are controlled by a first injection signal having a phase that is the same as a phase of the injection signal, and
wherein the second switch and the third switch are controlled by a second injection signal having a phase opposite to the phase of the injection signal.

19. The semiconductor device of claim 18, wherein the charging element is a capacitor, and the first to fourth switches are NMOS transistors.

* * * * *